United States Patent [19]

Shimaya et al.

[11] 4,020,343
[45] Apr. 26, 1977

[54] SCANNING ELECTRON DEVICE

[75] Inventors: Takashi Shimaya; Takao Namae; Kazuo Ishikawa, all of Tokyo, Japan

[73] Assignee: Nihon Denshi Kabushiki Kaisha, Tokyo, Japan

[22] Filed: Apr. 21, 1976

[21] Appl. No.: 678,770

[30] Foreign Application Priority Data

Apr. 23, 1975 Japan .............................. 50-49441
Oct. 1, 1975 Japan ............................ 50-118562

[52] U.S. Cl. ......................... 250/311; 178/DIG. 21
[51] Int. Cl.² ........................................ H01J 37/26
[58] Field of Search ............ 250/310, 311, 203 CT; 178/DIG. 24, 6.8

[56] References Cited
UNITED STATES PATENTS 3,795,808  3/1974  Drayton et al. .................... 250/310
3,953,669  4/1976  Saccomani et al. ........ 178/DIG. 21

Primary Examiner—Alfred E. Smith
Assistant Examiner—T. N. Grigsby
Attorney, Agent, or Firm—Webb, Burden, Robinson & Webb

[57] ABSTRACT

A scanning electron microscope or other type of scanning electron device incorporating a light pen for automatically changing the field of view of a specimen on a CRT. The output of said light pen controls the center and/or width of the scanning area of the incident electron beam irradiating the specimen when said light pen is directed towards a certain point in the initial specimen field of view on the CRT, thereby displaying said point at the center of the changed field of view on the CRT.

6 Claims, 9 Drawing Figures

SCANNING ELECTRON DEVICE

DETAILED DESCRIPTION

This invention relates generally to a specimen image display apparatus for use in a scanning electron microscope or similar type instrument, and more particularly to an apparatus for facilitating changeover from the initially displayed specimen image to the desired field of view of said specimen by designating a desired center point on the initial image with a light pen.

In a scanning electron microscope, an electron probe x-ray microanalyzer of the like, the electron probe irradiates and scans over a selected area of the specimen surface, the signal resulting from said electron probe irradiation being used as a brightness modulation signal for an image display means synchronized with said scanning of the electron probe. The magnification and field of view of the specimen image displayed on said display means depends on the extent and position of the electron beam scanning area on the specimen surface. Accordingly, it is necessary to adjust the electron probe deflecting signal and/or the specimen shifting mechanism in order to irradiate the center of the desired position on the specimen surface. This involves determining the desired field of view using a low magnification image, adjusting the electron probe deflecting signal and/or specimen shifting mechanism so as to display the desired point on the low magnification image at the approximate center of the viewing screen, and reducing the magnitude or amplitude of the scanning signal so as to display a higher magnification image on the viewing screen. Generally, the above procedure has to be repeated several times in order to observe the desired field of view which makes it time consuming and troublesome.

It is therefore an object of this invention to provide an improved image display apparatus in which the field of view is quickly and precisely adjusted.

Another object of this invention is to make it easier to precisely designate the exact field of view by using a light pen to mark the initial specimen image.

Yet another object of this invention is to provide a means for automatically adjusting the specimen shifting mechanism.

Figure 1:
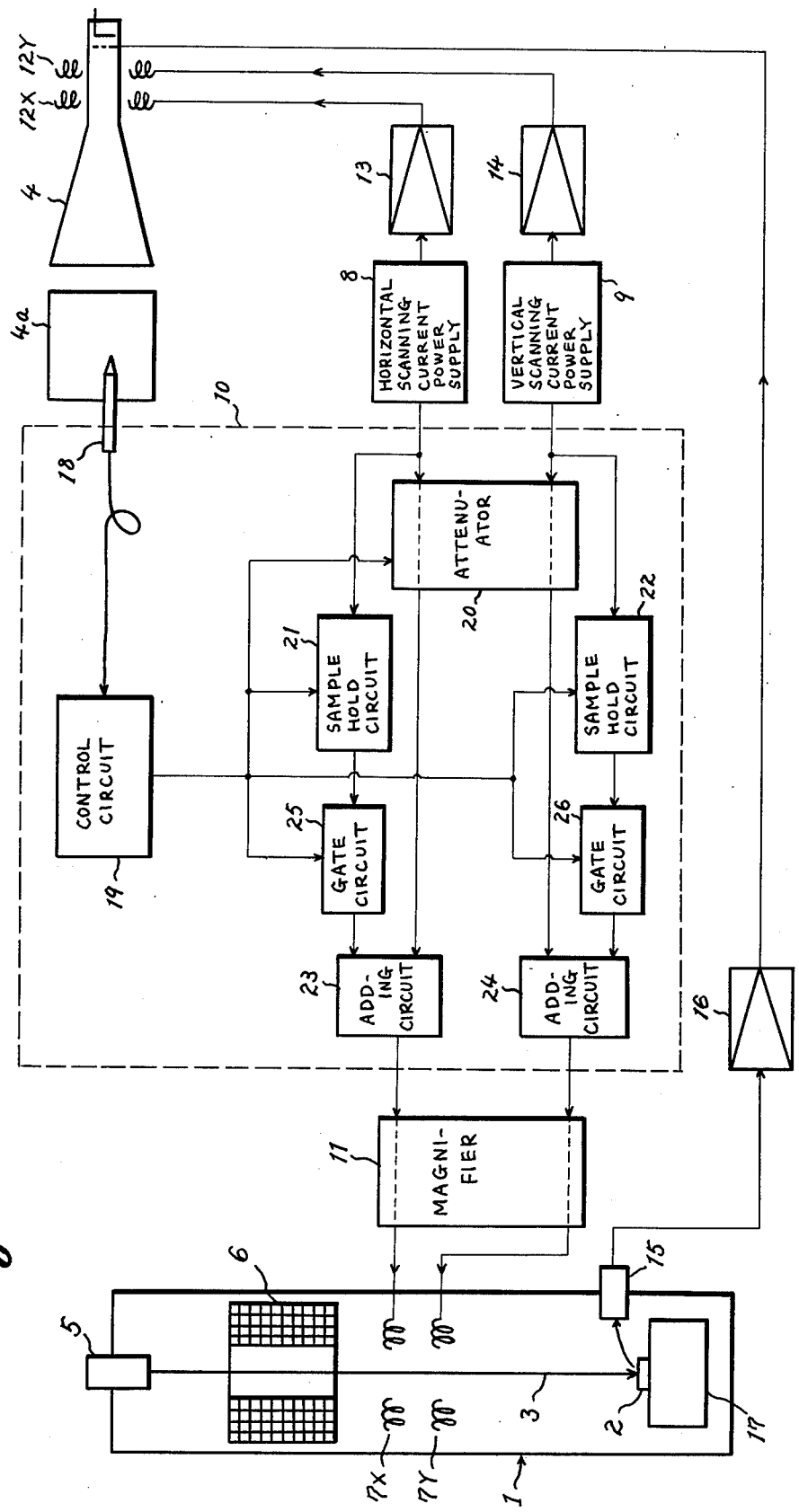
Figure 2:
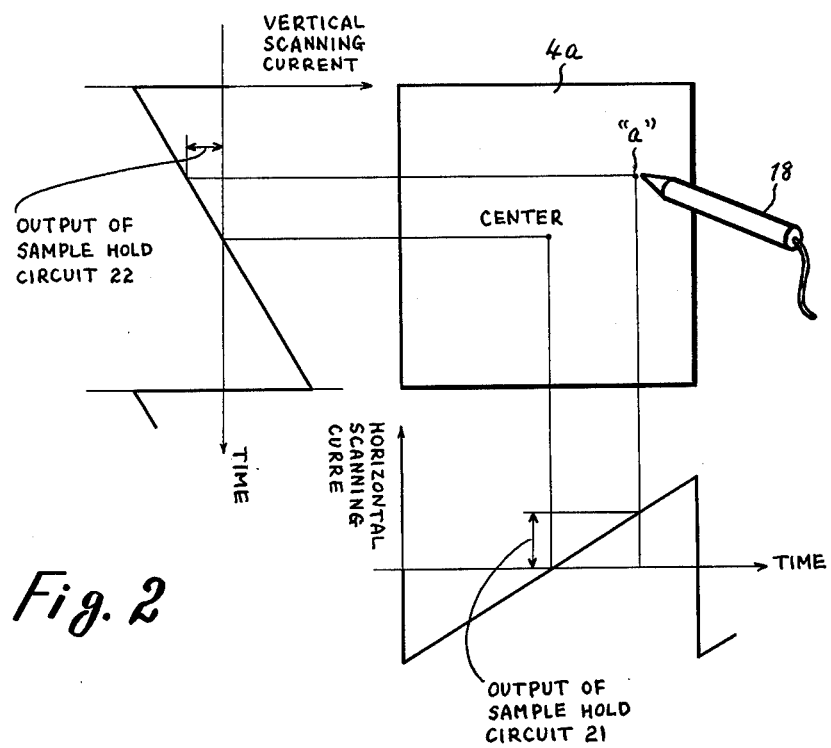
Figure 3:
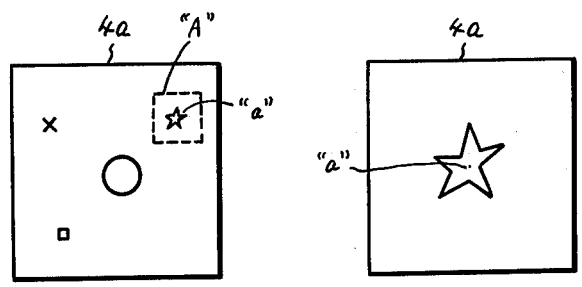
Figure 4:
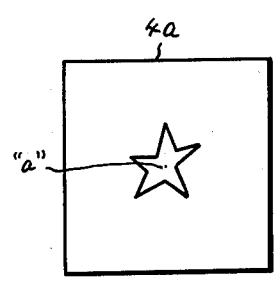
Figure 6:
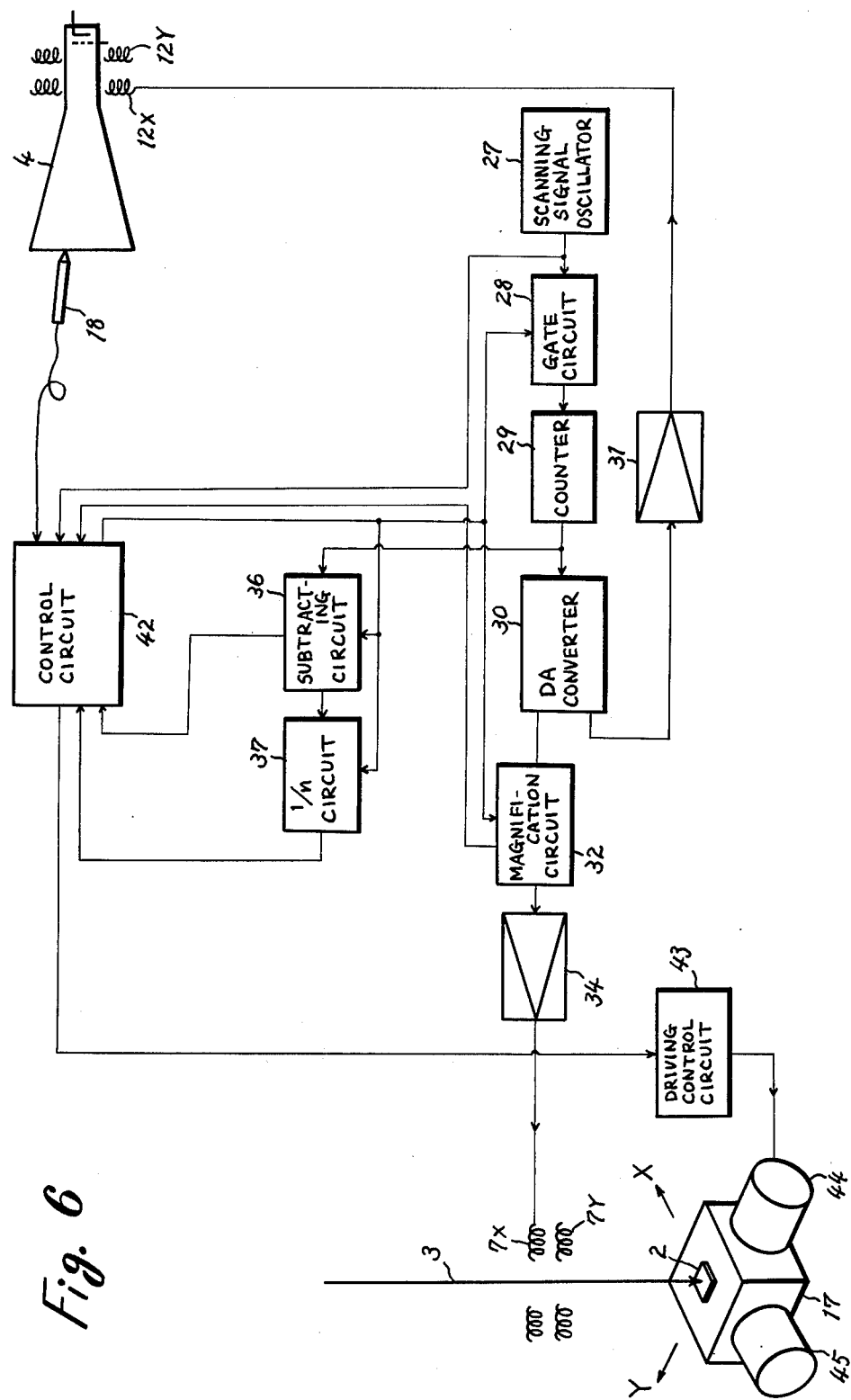
Figure 7:
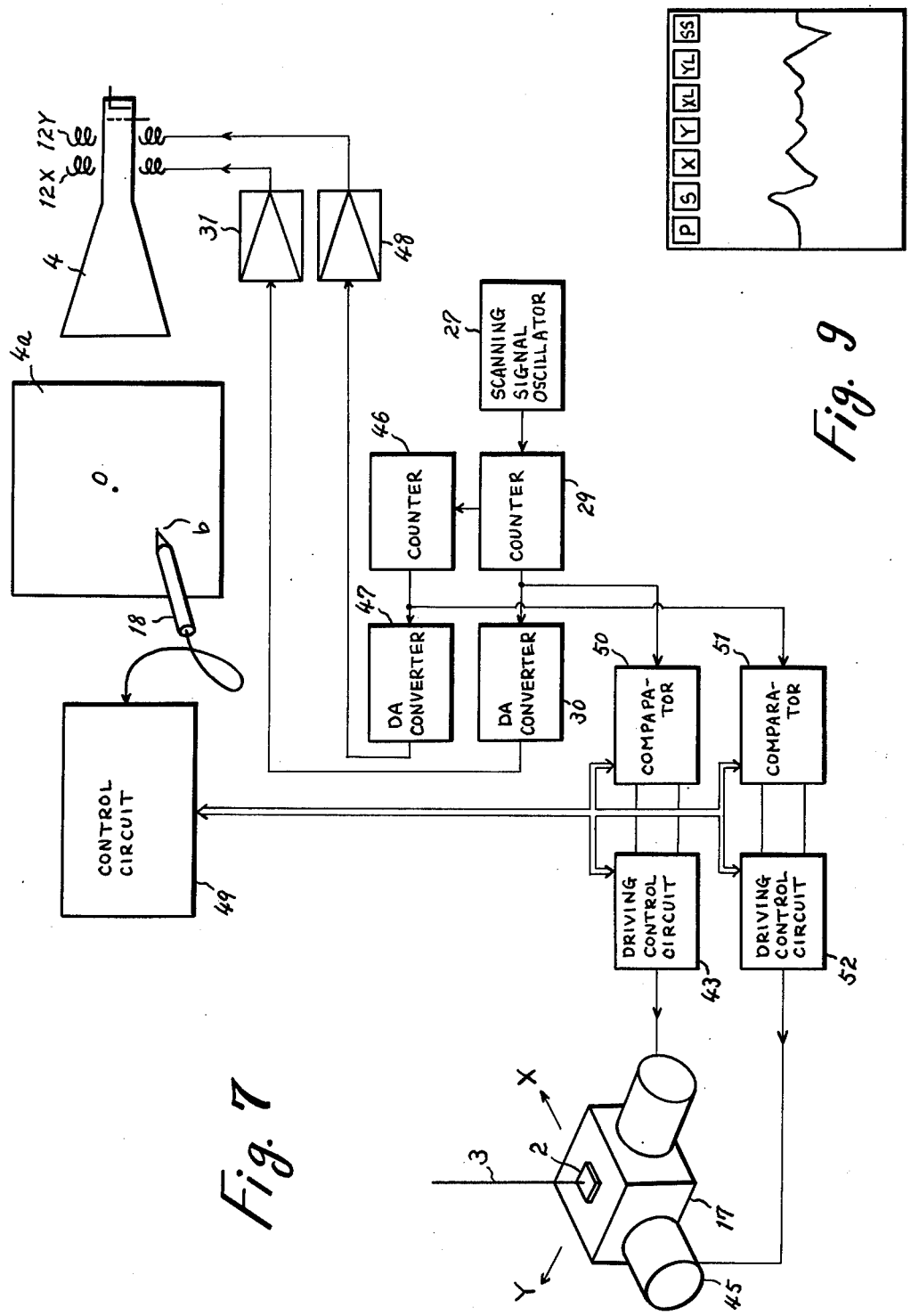
Figure 8:
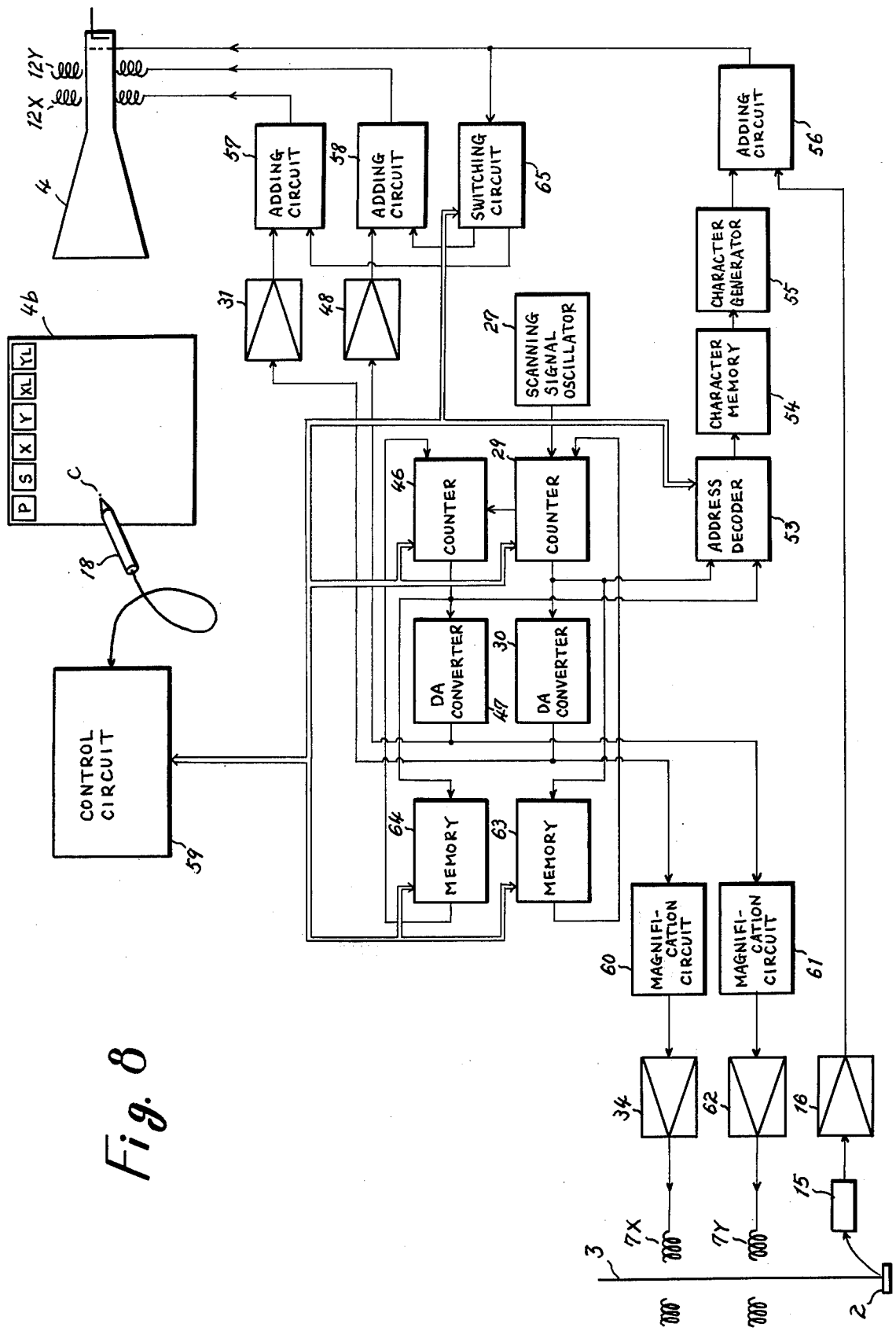

Other objects, features and advantages of this invention will become apparent by reading the following description in conjunction with the accompanying drawings of which:

FIG. 1 is a schematic drawing of one embodiment of this invention for automatically adjusting the field of view and magnification of the CRT image in a SEM type device, FIGS. 2, 3, and 4 are schematic drawings for explaining the operation of the embodiment shown in FIG. 1, FIGS. 5, 6, 7 and 8 are schematic drawings showing other embodiments of this invention, and FIG. 9 is a schematic drawing for explaining the operation of the embodiment shown in FIG. 8.

Referring to FIG. 1, this embodiment consists essentially of an electron microscope column 1 housing an electron optical system for irradiating and scanning a specimen 2 with an electron beam 3, and CRT (cathode ray tube image display unit) 4. The electron beam 3 generated by an electron gun 5 is condensed or focused by a condenser lens 6 to irradiate the specimen surface with a fine diameter probe. At the same time, the irradiating position is periodically changed by the action of deflecting coils 7X and 7Y, thereby two dimensionally scanning a fixed area of the specimen surface. The deflecting coils 7X and 7Y are respectively energized by horizontal and vertical scanning current power supplies 8 and 9 via various processing circuits enclosed by the broken line 10 and a magnifier 11. The same power supplies also serve to energize deflection coils 12X and 12Y of the CRT via amplifiers 13 and 14. By so doing, a scanning signal of fixed amplitude intensity is supplied to both deflecting coils 7X and 7Y and 12X and 12Y. Accordingly, the signal resultant upon the electron beam irradiating the specimen is detected by a detector 15, amplified by an amplifier 16 and then fed into the CRT 4, which is synchronized with the scanning of the electron beam, as a brightness modulation signal thereby producing a brightness modulation image of the scanned portion of the specimen on the screen of CRT 4. The magnification of the image, thus obtained, is controlled by varying the amplification of the scanning signal in the magnifier 11.

The general prior art observation procedure involves displaying the entire low magnification image on the screen, bringing the desired area of the specimen for critical examination to the approximate center of the screen with the microscope's mechanical specimen shifting mechanism 17, and then increasing the magnification of the specifically selected field of view by adjusting the magnifier 11. This procedure, is time consuming and accurate results are difficult to obtain.

In this invention, the various circuits enclosed by the broken line 10 are incorporated so as to obviate the need for the above troublesome operation. These circuits are designed to operate so that an optionally selected center point of the area of the specimen displayed on the CRT screen 4a is designated by a light pen 18 equipped, for example, with a photo-diode, Cds, etc. The light pen generates a signal when the electron beam of the CRT passes the point on the CRT raster where the pen is directed. The designated area is then centered and the image is changed instantaneously from a low magnification image to a high magnification image, the entire operation being automatic. Control circuit 19 generates a control signal for determining whether or not the signal detected by the light pen is applied to any of the other circuits enclosed by the broken line 10. Part of the control circuit 19 output signal is applied to an attenuator 20 which reduces the amplitude of the incoming sawtooth wave current from horizontal and vertical scanning current power supplies 8 and 9. As a result, the scanning region of the electron beam irradiating the specimen becomes narrower and the magnification of the image displayed on the CRT screen increases. At the same time, part of the respective output signals of said power supplies 8 and 9 are applied to sample hold circuits 21 and 22, the holding value of each sample hold circuit being determined by the time at which the output signal from the light pen via the control circuit 19 is applied. The holding values of the sample hold circuits equal the scanning signal values which correspond to the optionally selected center point of the specimen image designated by the light pen 18. FIG. 2 shows the relation between the holding value and the selected point $a$ on the CRT screen 4a. The output terminals of the sample hold circuits 21 and 22 are respectively connected to one of the input terminals of each of the adding circuits 23 and 24 via gate circuits 25 and 26 which are brought into the "open" state upon receipt of a signal from the control circuit 19. In other words, the adding circuits only receive signals from the sample hold circuits after the control circuit 19 has generated a signal. Further, since the scanning current passed through attenuator 20 is fed into the remaining input terminal of the respective adding circuits 23 and 24, the sample hold circuit output values determine the level of the scanning signal current output values of the adding circuits 23 and 24. Such being the case, the center of the electron beam irradiating area on the specimen surface can be shifted by deflecting coils 7X and 7Y which are supplied with said scanning current.

Supposing the light pen 18 is not being used and the attenuation ratio of the attenuator 20 is 1 for incoming scanning signals. Moreover, the sample hold circuits 21 and 22 do not operate and the gate circuits 25 and 26 remain closed. If the light pen 18 is then prepared for use, the light pen 18 will touch a center point $a$ of a certain area A forming part of the initial low magnification image displayed on the CRT screen, as shown in FIG. 3. At this time, the control circuit 19 supplies the attenuator 20 with a control signal so as to increase its attenuation ratio to more than 1, and also supplies the sample hold circuits 21 and 22 and the gate circuits 25 and 26 with control signals so that the level shift signals included in the deflecting signals are generated and fed to the inputs of the adding circuits 23 and 24 as mentioned above. By so doing, the horizontal and vertical scanning signals having the adjusted levels and the adjusted amplitudes are applied to the deflecting coils 7X and 7Y, whereas the scanning signals applied to the deflecting coils 12X and 12Y of the CRT 4 remain unchanged as far as the light pen designation is concerned. Accordingly, said area A will be displayed in an enlarged form as shown in FIG. 4 when the light pen touches said point $a$ on the initial low image. In this case, the magnification ratio of the two images can be varied by adjusting the attenuator 20. Additionally, if the attenuator 20 is omitted or maintains its attenuation ratio at unity regardless of the designation of the light pen, the embodiment shown in FIG. 1 can only be used for automatically shifting the field of view of a specimen image.

Figure 5:
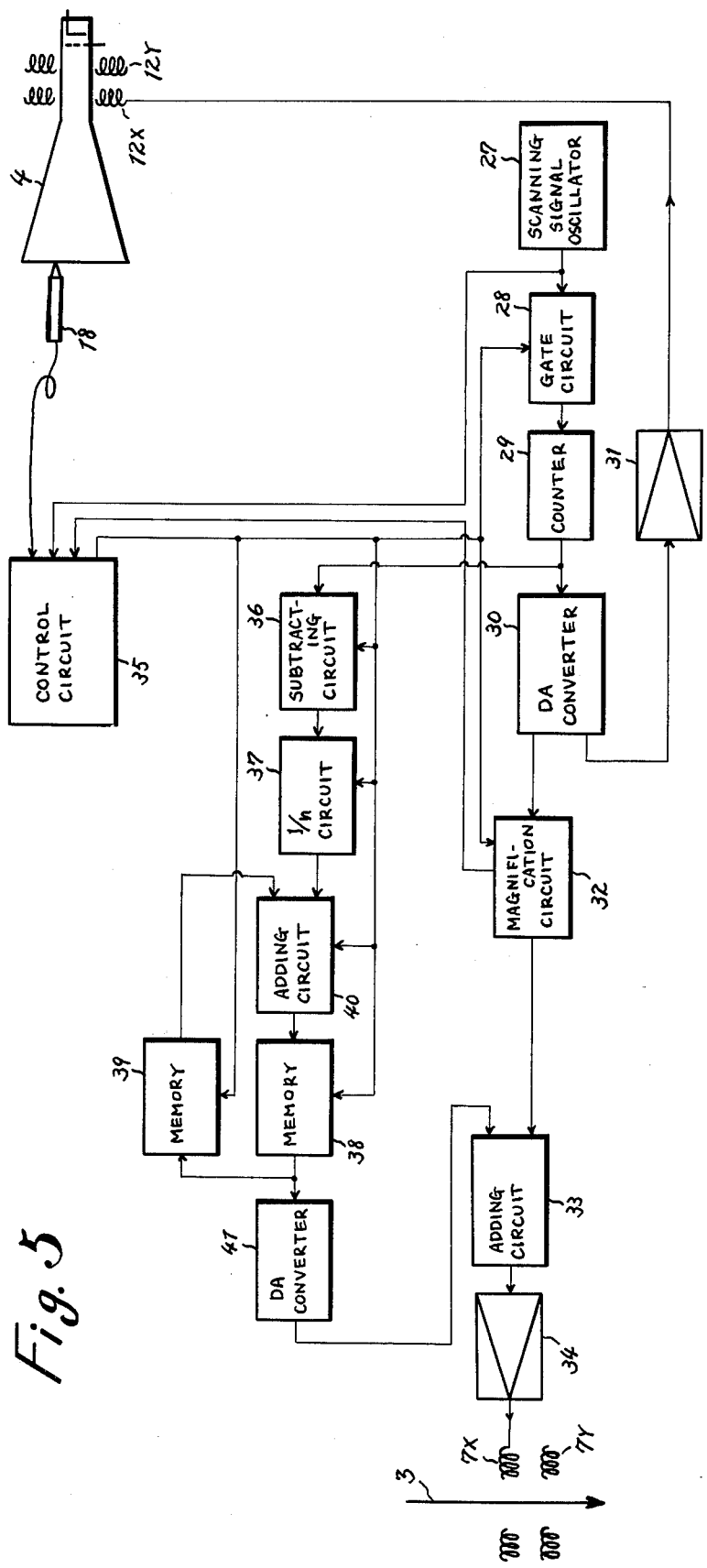

FIG. 5 shows another embodiment of this invention in which the digital circuits generate stepwise scanning signals instead of analog scanning signals as in the case of the embodiment shown in FIG. 1. In this embodiment, the horizontal scanning signal is generated by a scanning signal oscillator 27, a gate circuit 28, a counter 29 and a saw-tooth DA converter 30. One of the sawtooth outputs is fed to the deflecting coil 12X via amplifier 31, the other output being fed to the deflecting coil 7X via magnification circuit 32, an adding circuit 33 and an amplifier 34. The gate circuit 28, which is not absolutely necessary for this embodiment, is controlled by the control circuit 35 so as to deactivate the fore-circuits during the rise time and fall time of the output pulse of the scanning signal oscillator 27. The counter 29 is reset each horizontal sweep at some constant value and the counter output signal, which corresponds to the horizontal position (address) on the CRT 4, is fed into a subtracting circuit 36 where the difference between the counting address and the constant center address is worked out. The subtracting circuit 36 is operated when the light pen 18 touches one position on the CRT screen, the signal from the light pen 18 being fed into the subtracting circuit 36 via control circuit 35. Accordingly, the value of the output signal of the subtracting circuit 36 indicates the distance between the point designated by the light pen 18 and the center point on the CRT screen, said value being converted into a value corresponding to the actual amount of electron beam shift by a $1/n$ circuit 37. Here, the input signal is divided by the attenuation ratio $n$ corresponding to the magnitude of the low magnification image. The magnification circuit 32 also attenuates the incoming signal by an attenuation ratio $m$; i.e., by the ratio of the initial magnification image and the new high magnification image, when a control signal from the control circuit 35 is applied to said circuit 32. The two memory circuits 38 and 39 memorize the output of the $1/n$ circuit as the center address of the electron beam scanning area corresponding to the initial image, and the center address of the initial image is fed into an adding circuit 40. During this process, the memory circuits 38 and 39 in series function as a delay circuit. The output signal of the adding circuit 40 is then fed into the adding circuit 33 via the memory circuit 38 and DA converter 41 to shift the electron beam by an amount corresponding to the distance between the point designated by the light pen 18 and the center point on the CRT screen.

In a certain low magnification image observation, a part of the scanning signal from the DA converter 30 is fed into the deflecting coil 12X, the other part being fed into the electron beam deflecting coil 7X via the magnification circuit 32, the adding circuit 33 and the amplifier 34. Moreover, the magnification circuit 32 attenuates the amplitude of the input signal by a attenuation ratio $n_1$, and the adding circuit 33 adds the initial level signal from the memory circuit 38 to the input scanning signal. When the light pen 18 designates a optional point on the CRT screen 4a, the control circuit 35 supplies the magnification circuit 32 with a control signal so as to reduce the attenuation ratio $n_1$ to $n_2$. Moreover, the subtracting circuit 36 and $1/n$ circuit 37 are operated as mentioned above by the control signal from a control circuit 35. The output signal of the $1/n$ circuit 37, which divides the input signal by an attenuation ratio $n_1$, is fed into the adding circuit 40 and is added to the initial level signal, which is memorized in the memory circuit 39, as a level shift signal. The output of the adding circuit 33 via the memory circuit 38 and DA converter 41 as a new level signal. Here, the new level signal is memorized by the memory circuit 39 as a next initial level signal so as to enable the continuous use of the light pen 18. By so doing, a level and amplitude adjusted scanning signal is applied to the deflecting coil 7X, whereas the scanning signal applied to the deflecting coil 12X remains unchanged with regard to the light pen designation. Accordingly, an enlarged high magnification image of the selected point designated on the initial image by the light pen is displayed at the center of the CRT screen.

In the above embodiment, since the vertical scanning operation is the same as the horizontal scanning operation, a description of the former has been omitted. Suffice to say, the vertical scanning system is capable of achieving the same objectives as the embodiment shown in FIG. 1. Additionally, in this embodiment, the magnitude ratio $m=n_2/n_1$ of each image change is varied by adjusting the control circuit 35.

FIG. 6 shows yet another embodiment of this invention in which the field of view is shifted by displacing a specimen shifting mechanism 17 through the medium of an automatic driving system. The scanning signal circuit for energizing the deflecting coils 7X and 12X differs slightly from that shown in FIG. 5 in that the deflecting coil 7X is not directly supplied with a scanning signal from the magnification circuit 32 via the amplifier 34. Instead, the output of the 1/n circuit 37 is fed into the control circuit 42 which supplies a field of view shifting signal to the driving control circuit 43 in order to control a pulse motor 44 which is coupled to the rotating lever of the shifting mechanism 17. By so doing, the specimen is shifted in a direction perpendicular to the optical axis of the microscope; i.e., in the horizontally (X) direction. The field of view shifting signal generated by the control circuit 42 is determined by the output signals from the subtracting circuit 36, which is supplied with a signal from the counter 29 at the time when the light pen 18 touches the CRT screen works out the difference between the constant value (address) corresponding to the center position of the CRT 4 and the incoming counting value corresponding to the touching position of light pen. The difference signal thus obtained is converted into a value corresponding to the actual amount of electron beam shift by the 1/n circuit 37. At the same time, the subtracting circuit 36 generates a differential polarity signal which is fed into the control circuit 42. Thus, as previously explained, the 1/n circuit 37 output signal, which enters the driving control circuit 43 via the control circuit 42, automatically controls the shift of the specimen 2 in the X-direction by driving pulse motor 44 accordingly. A second pulse motor 45, when coupled to the same type of control system as described in the foregoing, can controllably shift the specimen in Y direction also.

Now when the light pen 18 touches a certain point on the CRT screen, the control circuit 42 supplies the magnification circuit with a control signal so as to change its magnification ratio from $n_1$ to $n_2$ as mentioned in the embodiment shown in FIG. 5, and supplies the subtracting circuit 36 and 1/n circuit 37 with a start and control signal so that the control signal for driving control circuit 43 is generated. Said control signal for the driving control circuit 42 controls the circuit 43 and pulse motor 44 so that the point on the specimen surface corresponding to the field point designated by the light pen on the CRT screen shifts the center of the electron beam scanning region. Accordingly, soon after the above shift is completed, an enlarged field of view around the point designated by the light pen on the initial low magnification image is displayed on the CRT screen.

Additionally, if the attenuation ratio of the magnification circuit 32 remains constant with respect to the designation of the light pen, the embodiment shown in FIG. 6 functions as a scanning electron microscope equipped with an automatic specimen shifting device.

The field of view shifting method embodied in FIG. 6 is superior to those embodied in FIGS. 1 and 5 in that the scanning center of the irradiating electron beam always passes through the center of the condenser lens system. Hence, the scanning images are not influenced by the off-axial aberration of the condenser lens, even at low magnification, as in the case of the embodiments described in FIGS. 1 and 5. However, a disadvantage inherent in the embodiment described in FIG. 6 is that fine adjustment is difficult in the high magnification range. This being the case, if the means for controlling the specimen shifting mechanism which is operated in the low magnification range is combined with the means for controlling the signal level of the scanning deflecting current which is operated in the high magnification range, an ideal embodiment for field of view control can be obtained.

FIG. 7 shows a simpler embodiment for controlling the specimen shifting mechanism. In this embodiment, the scanning signal producing circuit consisting of the scanning signal oscillator 27, counters 29 and 46, and DA converters 30 and 47 remains the same as in the embodiments shown in FIGS. 5 and 6 except that the outputs of the DA converters are amplified by amplifiers 31 and 48 before being applied to deflecting coils 12X and 12Y. The specimen, in this case, is shifted so that the center O of the field of view on the CRT screen 4a shifts in the direction of b designated by the light pen 18 during the time the light pen touches the CRT screen. When the light per 18 touches the b position, a control circuit 49, which receives the output signal from the light pen 18, supplies a control signal to comparators 50 and 51 and driving control circuits 43 and 52 in order to reset and operate said circuits during the time the light pen 18 touches the CRT screen 4a. Comparators 50 and 51 determine the polarity of the difference between the center address of the CRT screen 4a and the output address signals of the counters 29 and 46 when the output of the light pen is fed to the control circuit 49. Thus, by feeding the output of the respective comparators into driving control circuits 43 and 52, motors 44 and 45 are made to operate and shift the specimen so that the field of view shifts in the Ob direction until the light pen 18 is removed from the CRT screen 4a.

FIG. 8 shows a further embodiment of this invention in which different operation modes are selected and controlled by the light pen displaying characters on the CRT screen 4b along with the scanning image, and touching the displayed character with the light pen.

In this embodiment, the scanning position address on the CRT screen 4b is decoded in an address decoder 53 in accordance with the output signal from counters 29 and 46 which count the output pulses generated by the scanning signal oscillator 27. The decoded signal is then fed into a character memory 54 which selects the specific character, P, XP, YP, XS, YS, SP, etc, previously stored according to the input address signal and passes the information to a character generator 55 which generates a bright or dark signal so as to display a bright or dark character on the CRT screen 4b. The output signal of the character generator 55 and the amplified output signal of the electron detector 15, after being added in an adding circuit 56, is fed into the CRT 4 as a brightness modulation signal. The output signals from counters 29 and 46 are also supplied to DA converters 30 and 47 where they are converted into X and Y scanning signals, said signal being supplied to deflecting coils 12X and 12Y so as to display a character on the CRT screen 4b, after being amplified by amplifiers 31 and 48 and added by adding circuits 57 and 58.

The various operation modes are selected as follows. The picture (P) mode is obtained by touching the light pen 18 over the P area of the CRT screen 4b. By so doing, the control circuit 59 interprets the P mode in accordance with the output signal of the address decoder 53 and the time during which the light pen touches the CRT screen, and conveys the information to the various circuits. In the meantime, a portion of the sawtooth output of the DA converters is fed into magnification circuits 60 and 61 as digital scanning sweep signals where said signals are attenuated by 1/n, n being determined by the magnification at which it is desired to display the picture image. The selected output signals of the magnification circuits 60 and 61 are then applied to deflecting coils 7X and 7Y via amplifiers 34 and 62. In this particular operation mode, memory circuits 63 and 64 and switching circuit 65 are inoperable.

The spot (SP) mode is selected by touching the light pen 18 over the SP area of the CRT screen 4b. By so doing, the control circuit 59 interprets the SP mode in accordance with the output signal of the address decoder 53 and the time during which the light pen touches the CRT screen, and conveys the information to memory circuits 63 and 64 and counters 29 and 46. When the light pen 18 reaches position c, the memory circuits 63 and 64 hold the respective output signals from counters 29 and 46 and feed them back to the respective counters so as to lock the counter outputs. Consequently, the output signals of counters 29 and 46 and DA converters 30 and 47 always correspond to the position address of c. Thus, the electron beam irradiates the intended position on the specimen surface and subsequent analysis; e.g., quantitative x-rays analysis is effected by referring to the desired point.

The "X line scan" mode is selected by touching the light pen 18 over the XL area of the CRT screen 4b. By so doing, the control circuit 59 interprets the "X line scan" mode in accordance with the output signals of the address decoder 53 and the time during which the light pen touches the CRT screen, and conveys the information to the memory circuit 64 and the counter 46. When the light pen reaches position c, the memory circuit 62 holds the output signal from counter 46 and feeds it back to the counter 46 so as to lock the counter output. Consequently, the output signals of counter 46 and DA converter 47 always correspond to the Y-axis address of c, whereas the X-axis scanning signal is generated by counter 29 and DA converter 30. Thus, the electron beam scans the intended line of the specimen surface.

The "X line profile" mode is selected by touching the light pen 18 over the "XP" area of the CRT screen 4b. This operation mode differs from the "X line scan" mode in that a control signal from the control circuit 59 operates the switching circuit 65. By so doing, the output of the adding circuit 56 is applied to deflecting coil 12Y via adding circuit 58 and a X line profile is displayed on the CRT screen 4b as shown in FIG. 9.

Selection of the "Y line scan" and "Y line profile" mode is effected in more or less the same fashion as for the "X line scan" and "X line profile" modes.

Having this described our invention with the detail and particularity as required by the patent laws, what is desired protected by Letters Patent is set forth in the following claims.

We claim:

1. An apparatus for changing the field of view of a specimen in a scanning electron beam device comprising:
   means for irradiating the specimen surface with the primary electron beam,
   means for generating scanning signals,
   means responsive to the scanning signals for deflecting the primary electron beam over the specimen,
   means for detecting emissions from the specimen and providing an output signal indicative thereof,
   CRT display means responsive to the scanning signals and the detecting means output signal for displaying a scanning image,
   the improvement comprising a light pen detecting means for designating a point on the scanning image and creating a signal indicative of said point and means responsive to said signal from the light pen detecting means for adjusting a fixed signal level applied to said deflection means for shifting the designated point on the specimen image to the center of the field of view displayed on the CRT.

2. An apparatus for changing the field of view of a specimen in a scanning electron beam device comprising:
   means for irradiating the specimen surface with the primary electron beam,
   means for generating scanning signals,
   means responsive to the scanning signals for deflecting the primary electron beam over the specimen,
   means for detecting emissions from the specimen and providing an output signal indicative thereof,
   CRT display means responsive to the scanning signals and the detecting means output signal for displaying a scanning image,
   the improvement comprising a light pen detecting means for designating a point on the scanning image and creating a signal indicative of said point and means responsive to said signal from the light pen detecting mean for adjusting a fixed signal level and the amplitude of the scanning signals applied to said deflection means for shifting the designated point on the specimen image to the center of the field of view displayed on the CRT and changing the magnification of the image displayed on the CRT.

3. An apparatus for changing the field of view of a specimen in a scanning electron beam device comprising:
   means or irradiating the specimen surface with the primary electron beam,
   means for generating scanning signals,
   means responsive to the scanning signals for deflecting the primary electron beam over the specimen,
   means for detecting emissions from the specimen and providing an output signal indicative thereof,
   CRT display means responsive to the scanning signals and the detecting means output signal for displaying a scanning image,
   the improvement comprising a light pen detecting means for designating a point on the scanning image and creating a signal indicative of said point and means responsive to said signal from the light pen detecting means for shifting the specimen position and bringing the designated point on the specimen image to the center of the field of view displayed on the CRT.

4. An apparatus for changing the field of view of a specimen in a scanning electron beam device comprising:
   means for irradiating the specimen surface with the primary electron beam,
   means for generating scanning signals,
   means responsive to the scanning signals for deflecting the primary electron beam over the specimen,
   means for detecting emissions from the specimen and providing an output signal indicative thereof, CRT display means responsive to the scanning signals and the detecting means output signal for displaying a scanning image, the improvement comprising a light pen detecting means for designating a point on the scanning image and a shifting direction from the center of the field of view and creating a signal indicative of said shifting direction and means responsive to said signal from the light pen detecting means for shifting the specimen position to move the center of the field of view toward the designated point.

5. An apparatus for changing the field of view of a specimen in a scanning electron beam device comprising:

means for irradiating the specimen surface with the primary electron beam, means for generating scanning signals, means responsive to the scanning signals for deflecting the primary electron beam over the specimen, means for detecting emissions from the specimen and providing an output signal indicative thereof, CRT display means responsive to the scanning signals and the detecting means output signals for displaying a scanning image, the improvement comprising a light pen detecting means for designating a point on the scanning image and creating a signal indicative of said point and means responsive to said signal from the light pen detecting means for holding the scanning signal or signals of said scanning signal generator corresponding to the signal or signals directing the primary beam at the designated point.

6. An apparatus according to claim 5, in which a character display device for displaying characters on the CRT is provided so that a scanning mode may be selected by touching the light pen to one of said displaying characters.

* * * * *